US007355434B2

(12) United States Patent
Ikura et al.

(10) Patent No.: US 7,355,434 B2
(45) Date of Patent: Apr. 8, 2008

(54) LIGHTING INSPECTION DEVICE FOR PLASMA DISPLAY PANEL AND DISPLAY PANEL PRODUCING METHOD

(75) Inventors: Tsuneo Ikura, Ibaraki (JP); Takao Wakitani, Takatsuki (JP); Toshiya Otani, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/537,153

(22) PCT Filed: Sep. 28, 2004

(86) PCT No.: PCT/JP2004/014573

§ 371 (c)(1), (2), (4) Date: May 31, 2005

(87) PCT Pub. No.: WO2005/034166

PCT Pub. Date: Apr. 14, 2005

(65) Prior Publication Data

US 2006/0022684 A1 Feb. 2, 2006

(30) Foreign Application Priority Data

Oct. 1, 2003 (JP) ............................ 2003-343020

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS

| | | | | |
|---|---|---|---|---|
| 5,933,018 | A * | 8/1999 | Komatsu | 324/755 |
| 6,759,867 | B2 * | 7/2004 | Sohn | 324/770 |
| 6,933,990 | B2 * | 8/2005 | Park | 349/59 |

FOREIGN PATENT DOCUMENTS

| | | |
|---|---|---|
| JP | 54-068752 | 5/1979 |
| JP | 54-68752 | 6/1979 |
| JP | 2953039 | 7/1999 |
| JP | 2002-134025 | 5/2002 |
| JP | 2003-243855 | 8/2003 |

* cited by examiner

*Primary Examiner*—Ha Tran Nguyen
*Assistant Examiner*—Trung Q. Nguyen
(74) *Attorney, Agent, or Firm*—Wenderoth, Lind & Ponack, L.L.P.

(57) ABSTRACT

A light inspection device for performing lighting inspection of a display panel contains a circuit board having a driving circuit for a lighting display panel; a conductive chassis that functions as the ground potential of the driving circuit; and a conductive support member fixed to the chassis for fixing the circuit board. The chassis and the support member are joined via soft metal.

14 Claims, 5 Drawing Sheets

LIGHTING INSPECTION DEVICE FOR PLASMA DISPLAY PANEL AND DISPLAY PANEL PRODUCING METHOD

This application is a U.S. national phase application of PCT international application PCT/JP2004/014573.

TECHNICAL FIELD

The present invention relates to a lighting inspection device for testing image quality of a display panel including a plasma display panel, prior to mounting a driving circuit thereon, by sending lighting signals to the display panel to show an image, and also relates to a method of producing a plasma display panel.

BACKGROUND ART

Flat display devices, such as a plasma display device, generally mount a driving circuit thereon as a finished product. In a stage before mounting a driving circuit, a display panel undergoes a lighting test by the use of lighting signals, whereby a failed panel is detected so as not to join in the driving circuit-mounting process.

For example, Japanese Patent No. 2953039 introduces such an inspection device using a test probe pin. In addition, there is a suggestion that an electrode formed on a flexible printed circuit (hereinafter referred to as FPC) should be used as a lighting-test probe, instead of the aforementioned test probe pin.

The Lighting inspection devices above, however, have a pending problem—the characteristics of a panel itself cannot be accurately obtained because the electrical characteristics of the inspection device differs from that of a panel as a finished product.

It is therefore the object of the present invention to provide a lighting inspection device that improves the accuracy in the lighting inspection of a panel. More specifically, the characteristics of a panel itself, without being affected by the inspection device, can be accurately inspected under the display condition equivalent to that of a display panel as a finished product.

SUMMARY OF THE INVENTION

To achieve the object, the lighting inspection device of the present invention contains a circuit board on which a driving circuit for lighting a display panel is disposed; a conductive chassis functioning as a ground potential of the driving circuit; and a conductive member fixed to the chassis for holding the circuit board. In the device, the chassis and the member are joined through soft metal.

The inspection device structured above can accurately inspect for the characteristics of a panel itself without giving an influence of the device. Realizing the display condition equivalent to that of a display panel as a finished product, the inspection device enhances accuracy in the lighting inspection of a panel.

DETAILED DESCRIPTION OF THE INVENTION

Taking a plasma display panel (hereinafter, PDP) as an example of display panels, an exemplary embodiment of the present invention will be described hereinafter with reference to the accompanying drawings.

Figure 1:
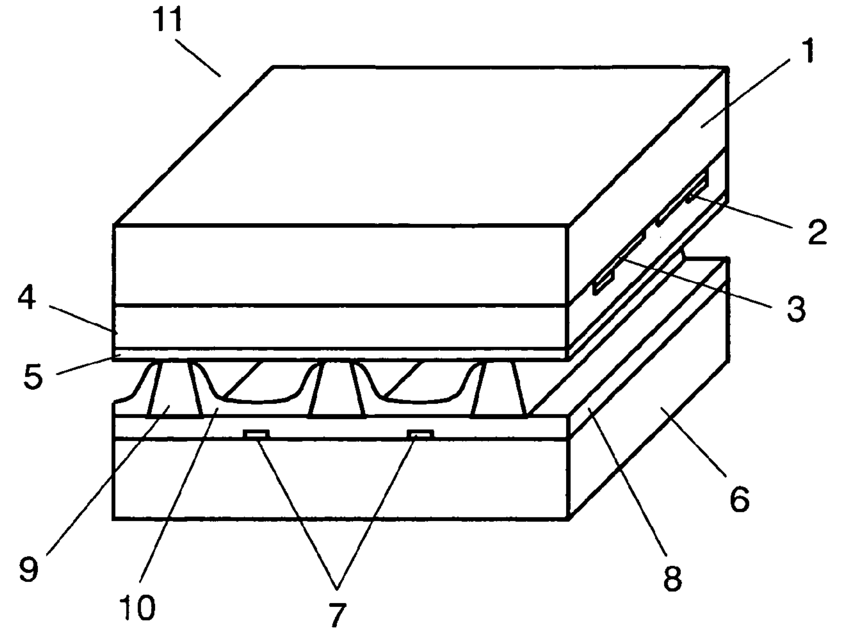
FIG. 1 is a perspective section view of the structure of a plasma display panel (hereinafter, PDP).

First, the structure of a PDP is described with reference to FIG. 1. FIG. 1 is a perspective section view illustrating the structure of a PDP. A plurality of rows of display electrodes made of pairs of scan electrodes 2 and sustain electrodes 3, each of which is arranged in a stripe, are formed on transparent front substrate 1 made of glass or the like. The display electrodes are covered with dielectric layer 4, and over which, protective layer 5 is formed.

On the other hand, on back substrate 6 confronting front substrate 1, a plurality of address electrodes 7 are disposed in a stripe-shaped arrangement so as to be orthogonal to scan electrodes 2 and sustain electrodes 3. Address electrodes 7 are covered with dielectric layer 8, and further on which, a plurality of barrier ribs 9 are formed parallel to address electrodes 7 so that each of address electrodes 7 is positioned between the adjacent ribs. Phosphor layer 10 for emitting red, green, and blue is formed on dielectric layer 8 between the adjacent ribs.

Such structured front substrate 1 and back substrate 6 are oppositely disposed so as to form a narrow discharge space therebetween, and then sealed together. The discharge space is filled with a discharge gas, namely, a mixture of neon and xenon. PDP 11 is thus structured. Discharge cells, each of which is a unit emission area, are formed at intersections of scan electrodes 2, sustain electrodes 3, and address electrodes 7. For full color display, three adjacent discharge cells for red, green, and blue emission of phosphor layer 10 form one pixel.

Figure 2A:
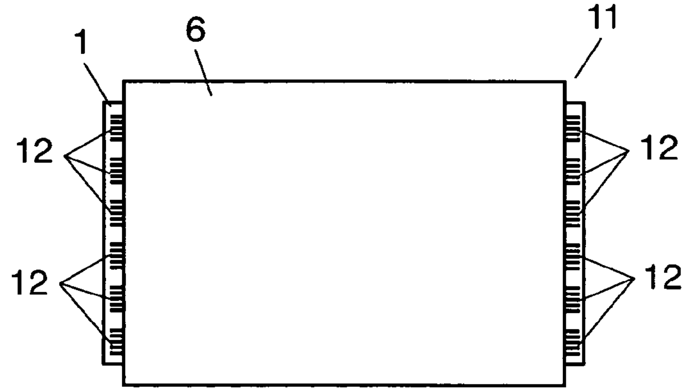
FIG. 2*a* is a backside view of a PDP.
Figure 2B:
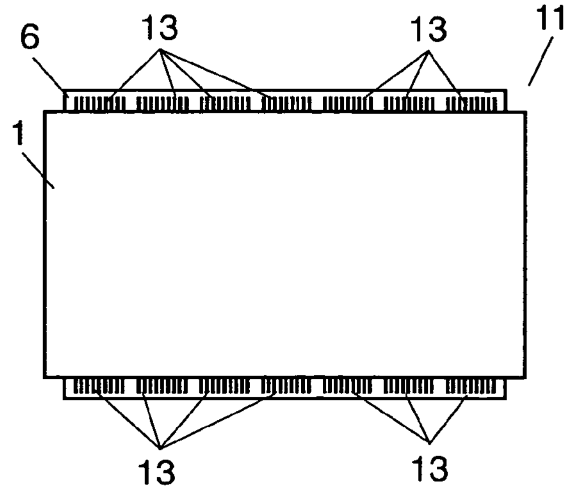
FIG. 2*b* is a front side view of a PDP.

FIG. 2*a* is a backside view of PDP 11, and FIG. 2*b* is a front side view of PDP 11. Each of substrates 1 and 6 of PDP 11 is formed substantially in a rectangular shape having long sides and short sides. Both of the short sides (i.e., the left and right ends) of front substrate 1 in FIG. 2*a* have electrode terminal block 12 formed of a predetermined number of electrode terminals, each of which is connected to scan electrode 2 or sustain electrode 3 disposed in the horizontal direction. Electrode terminal block 12 is divided into sub-blocks. Each sub-block is connected to a flexible printed circuit (FPC) for transmitting signals. On the other hand, as shown in FIG. 2*b*, both of the long sides (i.e., the top and bottom ends) of back substrate 6 have electrode terminal block 13 formed of a predetermined number of electrode terminals, each of which is connected to address electrode 7 disposed in the vertical direction. Similarly, electrode terminal block 13 is divided into sub-blocks, and each sub-block is connected to a FPC for transmitting signals. Address electrodes 7 are separately formed in the upper-half and the lower-half areas of back substrate 6 in the vertical direction of PDP 11. That is, PDP 11 employs a scanning method known as dual scanning, where scan electrodes 2 in the upper-half area and the lower-half area almost simultaneously undergo sequential scanning.

In PDP 11 employing the dual scanning, a scanning pulse is applied to scan electrodes 2, and an address pulse is applied to desired address electrodes 7. The application of the pulses triggers address discharge between scan electrodes 2 and address electrodes 7, whereby the discharge cells to be turned ON are selected. Subsequently, applying alternately reversing sustain pulses between scan electrodes 2 and sustain electrodes 3 leads to sustain discharge in the selected discharge cells. The sustain discharge allows phosphor layer 10 to emit, whereby an intended image is shown on the screen.

Figure 3:
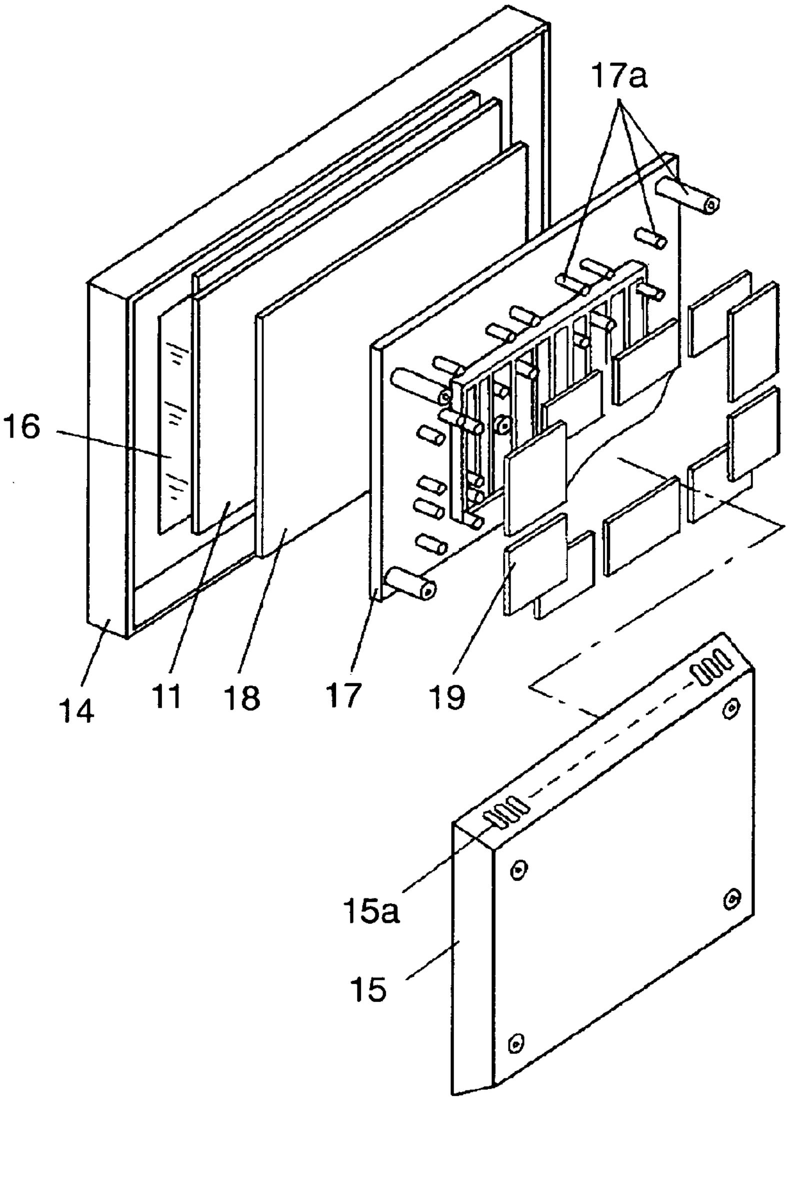
FIG. 3 is an exploded perspective view of the inner positional structure of a plasma display device using a PDP.

FIG. 3 shows a whole structure of a plasma display device employing PDP 11. In FIG. 3, the case accommodating PDP 11 therein is formed of front frame 14 and metallic back cover 15. The opening of front frame 14 is covered with front cover 16 made of glass or the like, which serves as an optical filter, as well as a protector of PDP 11. To suppress undesired radiation of electromagnetic waves, front cover 16 undergoes, for example, silver deposition. On the other hand, back cover 15 has a plurality of ventilating openings 15*a* to escape heat generated in PDP 11 to the outside.

PDP 11 is attached, via thermally conductive sheet 18, to the front surface of conductive chassis 17 made of aluminum or the like. To the back surface of chassis 17, a plurality of circuit boards 19 for driving PDP 11 are connected. Thermally conductive sheet 18 effectively transmits heat generated in PDP 11 to chassis 17 to dissipate it. Circuit boards 19 have electric circuits for driving and controlling PDP 11. The circuits of circuit boards 19 are electrically connected to electrode terminal blocks 12 and 13 disposed on the ends of PDP 11 through a plurality of FPCs (not shown) extending over each end of chassis 17.

In addition, the back surface of chassis 17 contains support members 17*a* for fixing back cover 15 and circuit boards 19. Chassis 17 is formed by, for example, die-casting. Support members 17*a* are integrally formed with chassis 17. Fixing circuit boards 19 to support members 17*a* enables chassis 17 to function as a ground potential to the electric circuits of circuit boards 19.

Figure 4:
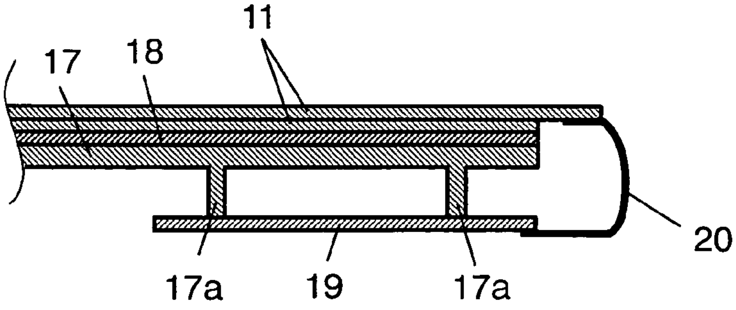
FIG. 4 is a section view of an end of a member accommodated in the casing of a plasma display device.

FIG. 4 shows a section view of the end of a member accommodated in the case of the plasma display device shown in FIG. 3. As shown in FIG. 4, each of circuit boards 19 is connected to PDP 11 via FPC 20. Circuit boards 19 are located close to the ends of PDP 11 so as to save the length of FPC 20.

Next will be described a method of producing a PDP.

First, scan electrodes 2 and sustain electrodes 3 are formed on front substrate 1. Electrodes 2 and 3 are covered with dielectric layer 4, and over which, protective layer 5 is formed.

On the other hand, address electrodes 7 are formed on back substrate 6, further on which dielectric layer 8 is disposed so as to cover address electrodes 7. After that, barrier ribs 9 and then phosphor layer 10 are formed on dielectric layer 8.

As the next step, glass frit is applied to the periphery of back substrate 6 structured above and dried. Back substrate 6 is attached to front substrate 1 covered with protective layer 5 and the two substrates undergo a heat treatment to be sealed with glass frit applied to the peripheries. After the sealing, the discharge space formed between front substrate 1 and back substrate 6 is evacuated and then filled with a predetermined discharge gas. PDP 11 is thus completed.

PDP 11, however, generally exhibits a high operating voltage—the voltage required for uniformly illuminating the entire panel—and the discharge itself is in an unstable condition. Such a panel is therefore aged to lower the operating voltage and obtain uniform and stable discharge characteristics. Generally, in an aging process, an alternating voltage is applied between scan electrodes 2 and sustain electrodes 3 to intentionally generate discharge in all of the discharge cells for a determined period of time.

After the aging, PDP 11 undergoes a lighting inspection. That is, prior to the process of mounting driving circuits, PDP 11 is judged by the test whether it is a good quality item or not. PDP 11 that has passed the test goes to the next processes of attaching FPCs to electrode terminal blocks 12 and 13, mounting the driving circuits on the chassis, and accommodating required components into the case formed of front frame 14 and back cover 15. The plasma display device shown in FIG. 3 is thus obtained.

Next will be described a lighting inspection device used for lighting inspection of a display panel, such as PDP 11.

Figure 5:
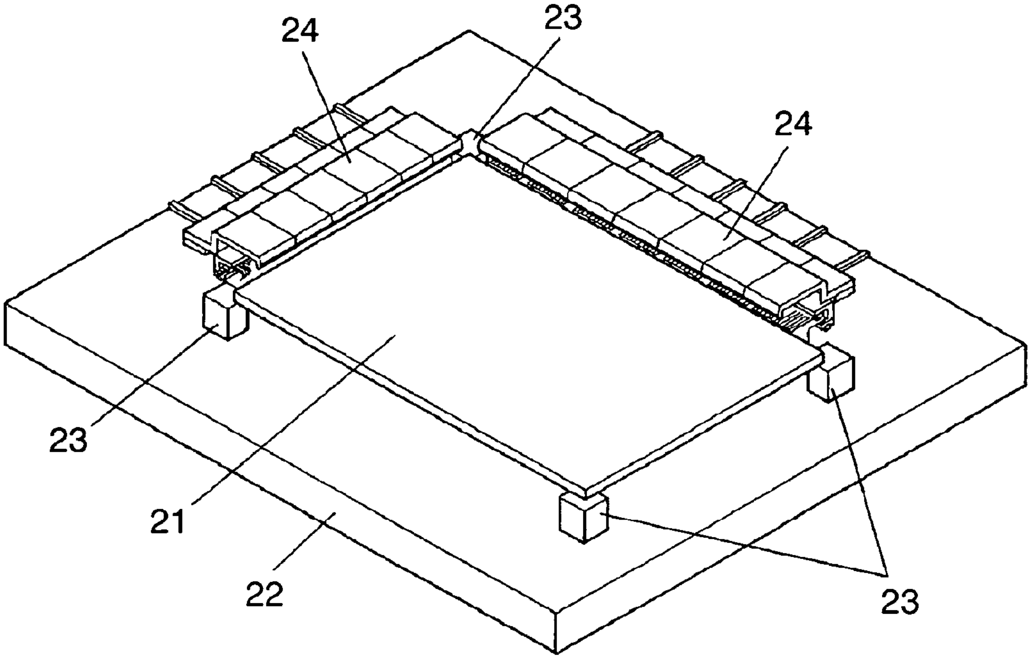
FIG. 5 is a perspective view of the entire structure of a lighting inspection device of an embodiment of the present invention.
Figure 6:
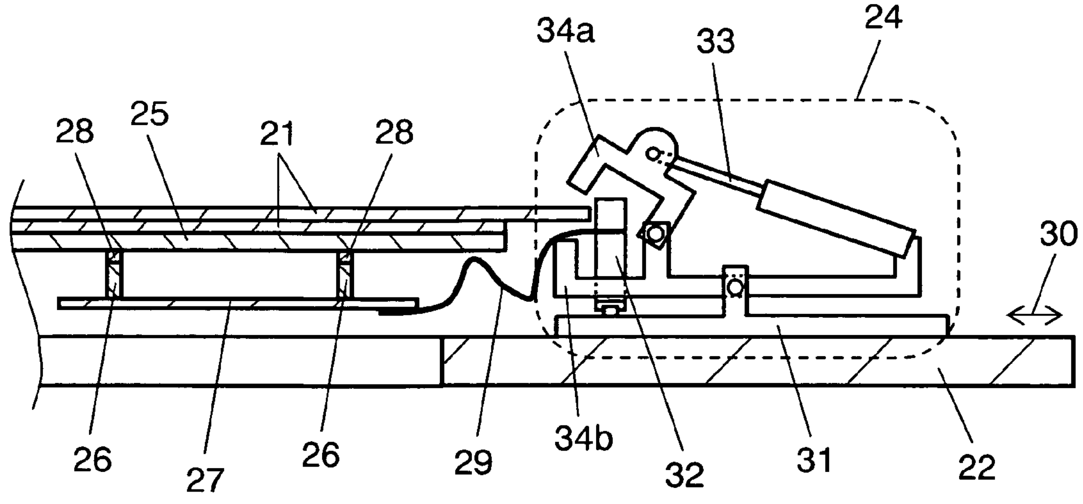
FIG. 6 is a section view of the essential structure of the lighting inspection device.
Figure 7:
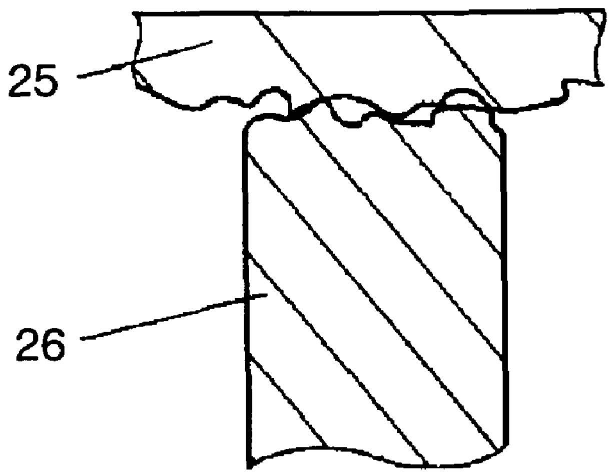
FIG. 7 is a section view of the joint section of the support member and the chassis with no use of soft metal therebetween.

FIG. 5 is a perspective view of the entire structure of a lighting inspection device of an embodiment of the present invention. FIG. 6 is a section view of the essential structure of the device. Display panel 21 shown in the drawings is the aforementioned PDP 11.

According to the lighting inspection device, as shown in FIG. 5, panel holders 23 for holding the four corners of display panel 21 are disposed on base 22 of the device. Signal feeders 24 for supplying panel 21 with lighting signals is disposed along each side of panel 21 so as to correspond to the electrode terminals. It will be understood that the electrode terminals are disposed on the four sides of panel 21, like PDP 11 shown in FIG. 2, and accordingly, signal feeders 24 should be located at corresponding positions. For convenience sake, some of signal feeders 24 are omitted in FIG. 5.

The lighting inspection device contains, as shown in FIG. 6, conductive chassis 25 on which display panel 21 is to be mounted for the inspection. On the back side of chassis 25, circuit board 27 having a driving circuit for lighting display panel 21 is fixed via conductive support members 26. Soft metal 28 is provided at the joint section between chassis 25 and each of support members 26. A light-on signal fed from the driving circuit is transmitted, via signal transmitter 29 connected to circuit board 27, to an electrode terminal of display panel 21. Signal transmitter 29 may be formed of an FPC. On base 22, slide base 31 is slidably disposed in the direction indicated by arrow 30. Slide base 31 contains holder 32 and contact keeper 33. Holder 32 retains the end of signal transmitter 29, and contact keeper 33 maintains the contact between the electrode terminal and signal transmitter 29 so that the light-on signal is fed to display panel 21. Contact keeper 33 is formed of upper unit 34*a* and lower unit 34*b* axially fixed with each other so that the end of the units can be freely open and closed, and a driver for moving units 34*a* and 34*b*. Signal transmitter 29 is pressed against display panel 21 by upper unit 34*a* and lower unit 34*b*, so that light-on signals fed from the driving circuit is carried to the electrode terminal of display panel 21. Slide base 31, holder 32, and contact keeper 33 thus form signal feeding device 24 described above.

Next will be described how the lighting inspection device works.

First, to avoid interference between contact keeper 33 and display panel 21 when panel 21 to be tested is put on panel holders 23, slide base 31 should be moved toward the edge so as to move signal feeding device 24 away from chassis 25, and keep upper unit 34*a* and lower unit 34*b* open. Display 21 should be placed on panel holders 23 with an alignment as required. After panel 21 is properly positioned on chassis 25, signal feeding device 24 should be moved back toward panel 21. Next, at least one of upper unit 34*a* and lower unit 34*b* should be moved to pinch together the end of panel 21 and the end of signal transmitter 29 therebetween. In this way, display panel 21 and signal feeding device 24 make contact at each terminal.

Following the completion of the panel setting, a light-on signal from the driving circuit of circuit board 27 should be supplied to panel 21 via signal transmitter 29 to start the lighting inspection. After the inspection, the ends of panel 21 and signal transmitter 29 should be released from upper unit 34*a* and lower unit 34*b*. Next, signal feeding device 24 should be moved in a direction away from panel 21 to avoid interference between signal feeding device 24 and display panel 21, and subsequently, panel 21 should be removed from chassis 25 and panel holders 23. The procedures above should be repeated for each display panel 21 to be tested.

The inspection of display panel 21 should preferably be performed under the state in which the display condition equivalent to that of a finished panel as a product.

According to the display device shown in FIG. 4, as described earlier, circuit board 19 is disposed close to the end of PDP 11. On the other hand, in the lighting inspection device of display panel 21 shown in FIG. 6, circuit board 27 has to be positioned inward so as to avoid interference between signal feeding device 24 and circuit board 27. Therefore, chassis 17 of the display device cannot be utilized for the chassis of the lighting inspection device.

Producing chassis 25 by die casting, like chassis 17 of a display device, can be an option. However, the necessity of making a metallic mold considerably raises the production cost.

To obtain a versatile and low-cost chassis of the lighting inspection device, there is a method in which the support members for the circuit board are screw-held to a proper position on the flat chassis. When the screw-held joint section is microscopically observed, it will be understood that chassis 25 and support member 26 have different surface roughness, wherein chassis 25 makes more than point contact with support member 26 at the joint between them. Compared to the structure of chassis 17, electrical contact resistance between chassis 25 and support member 26 of the lighting inspection device increases, resulting in increased impedance.

In the lighting inspection device for display panel 21, chassis 25 is not merely a part required for the entire structure. Instead, chassis 25 also plays an electrically important role in providing ground potential to the driving circuit mounted on circuit board 27. Lighting display panel 21, such as a PDP, needs a large electric current to pass from circuit board 27 to chassis 25 via support members 26. Under this circumstance, chassis 25 having ground potential is of particular importance. When impedance between chassis 25 and support member 26 increases, as described above, an experiment has found that, compared to the structure having the chassis produced by die casting shown in FIGS. 3 and 4, the structure having a point contact between chassis 25 and support member 26 distorts a driving waveform to be applied to display panel 21. As a result, the lighting inspection cannot realize the display condition the same as that of panel 21 as a finished product, lowering accuracy in testing. The lack of accuracy has often led to an incorrect judgment such as a faulty panel being passed through the inspection and carried to the next step, or a non-defective panel being judged to be defective.

Figure 8:
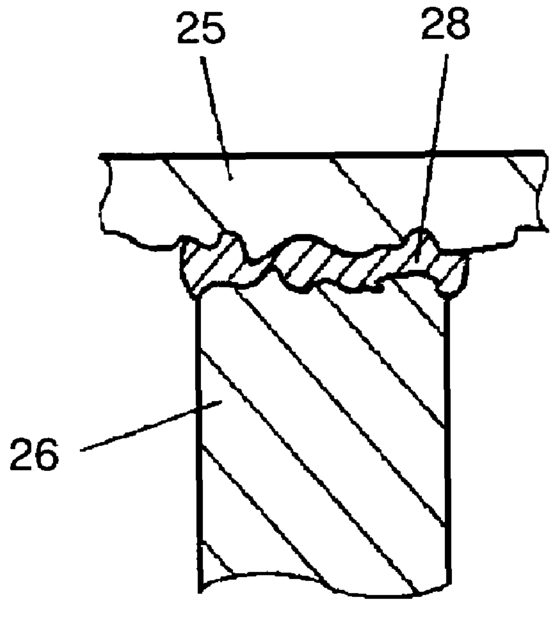
FIG. 8 is a section view of the joint section of the support member and the chassis in the lighting inspection device of an embodiment of the present invention.

According to the lighting inspection device of the present embodiment, as shown in FIG. 6, soft metal 28 is provided between chassis 25 and support member 26. FIG. 8 shows an enlarged view of the joint section. Each surface of chassis 25 and support member 26 confronting via soft metal 28 is defined as respective joint surface. Each joint surface of chassis 25 and support member 26 has a different surface roughness. Filling in the irregularities, soft metal 28 enables chassis 25 and support member 26 to have surface contact, thereby decreasing impedance between chassis 25 and support member 26.

Figure 9:
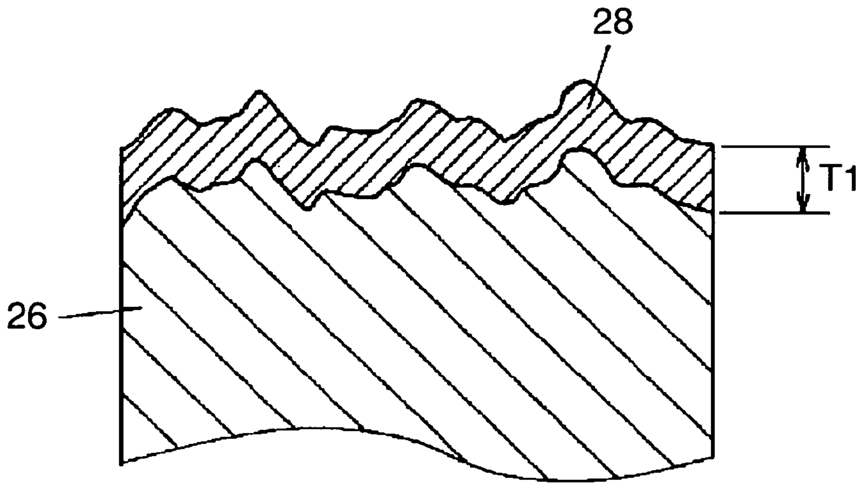
FIG. 9 is a section view illustrating the state where soft metal is applied to the support member of the lighting inspection device.

Next will be described how to obtain the structure above. First, as shown in FIG. 9, soft metal 28 is formed on the joint surface of support member 26. Pure gold is plated on the surface to a predetermined thickness. In addition to plating, soft metal 28 can be formed by an electron beam deposition method, coat-and-dry method, sputtering, or chemical vapor deposition (CVD) method. Conforming to the irregularities of the joint surface of support member 26, soft metal 28 has almost an even thickness. Prior to forming soft metal 28, the joint surface of support member 26 undergoes a cleaning process by degreasing, cleaning, or the like, to enhance adhesion to soft metal 28 and to suppress the increase in undesired electric contact resistance.

Support member 26 having soft metal 28 thereon is secured to chassis 25 by a screw from the side of chassis 25 with a torque of 0.2-1.0 N·m. Tightening torque of the screw alters the shape of soft metal 28 formed on support member 26, so that the irregularities on the joint surfaces of support member 26 and chassis 25 are filled with soft metal 28. This enables support member 26 and chassis 25 to have surface contact via soft metal 28. The structure shown in FIG. 8 is thus obtained.

Next will be described the thickness of soft metal 28 to be formed on the joint surface of support member 26. The joint surface of support member 26 and the joint surface of chassis 25 have a different surface roughness. Now suppose that average roughness Ra of the joint surface of support member 26 is represented by X (μm); average roughness Ra of the joint surface of chassis 25 is represented by Y (μm); and Ta=X+Y. When thickness T1 of soft metal 28 formed on support member 26 takes the value of Ta (μm), the irregularities between the surfaces of support member 26 and chassis 25 are filled with deformed soft metal 28 provided at the screw-held joint section between support member 26 and chassis 25. That is, in forming soft metal 28 on support member 26, determining thickness T1 of soft metal 28 to be greater than Ta (μm) can bring a surface contact in almost all the joint section between the two joint surfaces. It is not preferable to determine thickness T1 to be smaller than Ta (μm) because the reduced contact area contributes to increased impedance between support member 26 and chassis 25. The average roughness may be arithmetical mean, or may be averaged ten point height of irregularities.

Supposing that the maximum height of irregularities, i.e., the peak height on the joint surface of support member 26 is represented by Xp (μm); similarly, the maximum height of irregularities, i.e., the peak height on the joint surface of chassis 25 is represented by Yp (μm); and Tb=Xp+Yp. Here, the peak height on the joint surface represents the difference between the highest position and the lowest position of the irregularities on each joint surface. Determining thickness T1 of soft metal 28 formed on support member 26 to take the value of Tb (μm) ensures the surface contact throughout the joint surfaces between support member 26 and chassis 25. Thickness T1 of soft metal 28 can be formed larger than Tb (μm); however, a larger thickness than required invites a rise in costs. Taking this into consideration, the thickness should be properly determined.

Figure 10:
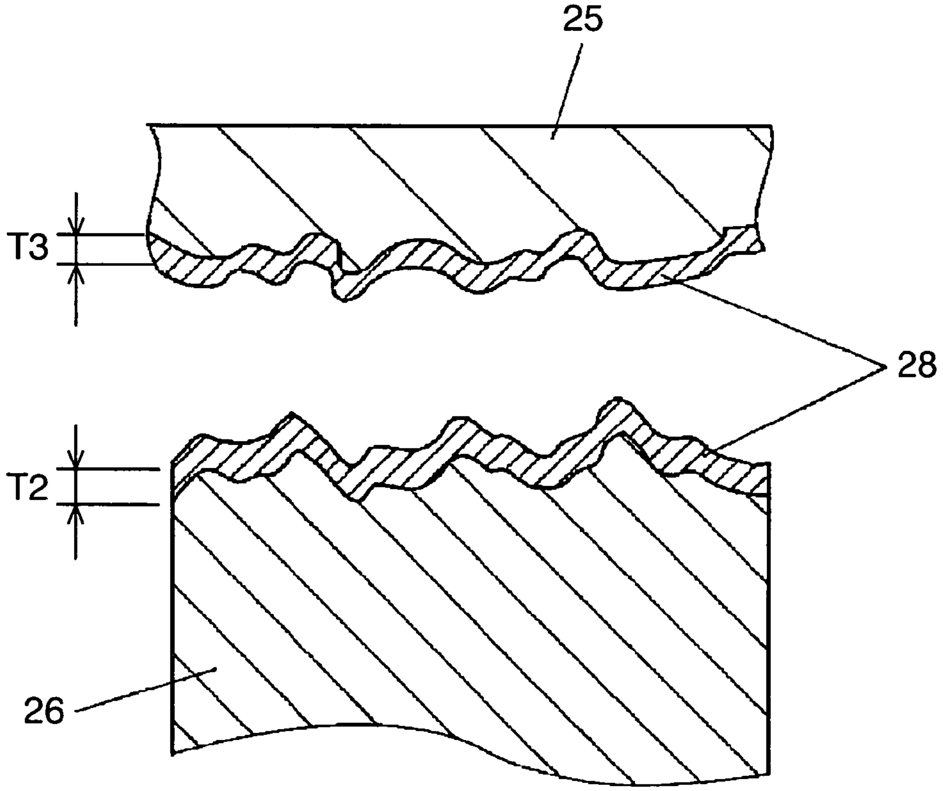
FIG. 10 is a section view illustrating the state where soft metal is applied to both of the support member and the chassis of the lighting inspection device.

Although FIG. 9 shows the example in which soft metal 28 is formed on the joint surface of support member 26 only, soft metal 28 may be formed on the joint surface of chassis 25 only. Furthermore, as shown in FIG. 10, soft metal 28 may be formed on both the joint surfaces of support member 26 and chassis 25. With the use of pure gold as a material, soft metal 28 is formed on the joint surfaces by plating, electron beam deposition method, coat-and-dry method, sputtering, or chemical vapor deposition (CVD) method. After that, support member 26 having soft metal 28 thereon is secured to chassis 25 also having soft metal 28 thereon by a screw from the side of chassis 25 with a torque of 0.2–1.0 N·m. Tightening torque of the screw alters the shape of soft metal 28 formed on the joint surfaces of support member 26 and chassis 25, so that the irregularities on the joint surfaces of support member 26 and chassis 25 are filled with soft metal 28. This enables support member 26 and chassis 25 to have surface contact via soft metal 28. The structure shown in FIG. 8 is thus obtained.

Now suppose that the film thickness of soft metal 28 formed on support member 26 is represented by T2 (μm) and the film thickness of soft metal 28 formed on chassis 25 is represented by T3 (μm). When total thickness (T2+T3) takes a value greater than Ta (μm), chassis 25 and support member 26 have a surface contact in almost all the joint surfaces. In contrast, determining thickness T2+T3 to be smaller than Ta (μm) is not preferable because the reduced contact area contributes to increased impedance between support member 26 and chassis 25. Determining thickness (T2+T3) to take the value of Tb (μm) ensures the surface contact throughout the joint surfaces between support member 26 and chassis 25. Thickness (T2+T3) of soft metal 28 can be formed much larger; however, an unnecessarily large thickness invites a rise in costs. Taking this into consideration, the thickness should be properly determined.

When soft metal 28 is formed on both the joint surfaces of support member 26 and chassis 25, as shown in FIG. 10, each of thickness T2, T3 can be smaller than thickness T1 in FIG. 9, that is, T2<T1, T3<T1. Compared to the case in FIG. 9, soft metal 28 can be easily formed on the joint surface. Besides, in the structure in FIG. 10, support member 26 and chassis 25 are joined through soft metal 28 formed on each joint surface. Compared to the joint in FIG. 9, this joint can further reduce impedance at the joint section between support member 26 and chassis 25.

Attaching support member 26 to chassis 25 via soft metal 28, as described above, enables support member 26 and chassis 25 to have a surface contact via soft metal 28 in almost all the joint surfaces. This can bring about the situation in which display panel 21 undergoes the lighting inspection by the application of a driving waveform equivalent to that applied to a finished panel. That is, the lighting inspection can be carried out under the display condition the same as that of a finished product, whereby accuracy in the inspection is enhanced. In addition, the structure of the present embodiment has no need to form the chassis by die casting for the inspection, thereby obtaining a low-cost lighting inspection device.

Although the embodiment above introduces an example in which soft metal 28 is made of pure gold, it is not limited thereto; other soft metal can be used, as long as the soft metal has a low resistance and varies its shape enough for filling in the irregularities on both the joint surfaces of support member 26 and chassis 25 when support member 26 is fixed to chassis 25. For example, materials containing gold or silver, an alloy containing gold as a major component, pure silver, or an alloy containing silver as a major component, can be the material of soft metal 28. The present invention is also applicable to a field-emission display.

INDUSTRIAL APPLICABILITY

The present invention, as described above, can provide a lighting inspection device capable of performing lighting inspection for a display panel under the display condition equivalent to that of a finished panel as a product, and also provide a method of producing a display panel. This is a great convenience to test display panels, such as a plasma display panel, in lighting inspection.

The invention claimed is:

1. A lighting inspection device for carrying out lighting inspection of a display panel, the device comprising:
- a circuit board having a driving circuit mounted thereon for lighting the display panel; and
- a conductive chassis functioning as a ground potential of the driving circuit;
- wherein the circuit board is fixed to the conductive chassis via a conductive member, and
- wherein a soft metal is disposed at a joint section between the conductive chassis and the conductive member.

2. The lighting inspection device of claim 1, wherein the soft metal is formed on at least one of facing surfaces of the conductive member and the conductive chassis.

3. The lighting inspection device of claim 2, wherein the soft metal is so formed that a thickness of the soft metal is a value not less than a summed value of a surface roughness of the conductive member and a surface roughness of the conductive chassis.

4. A method of inspecting a display panel, the method comprising:
- detecting a defective panel before a driving circuit is mounted on a display panel such that the display panel undergoes lighting inspection with a use of the lighting inspection device described in claim 3.

5. The lighting inspection device of claim 3, wherein the surface roughness of the conductive member and the surface roughness of the conductive chassis represents a respective average roughness.

6. A method of inspecting a display panel, the method comprising:
- detecting a defective panel before a driving circuit is mounted on a display panel such that the display panel undergoes lighting inspection with a use of the lighting inspection device described in claim 5.

7. The lighting inspection device of claim 3, wherein the surface roughness of the conductive member and the surface roughness of the conductive chassis represents a respective maximum height of irregularities.

8. A method of inspecting a display panel, the method comprising:
- detecting a defective panel before a driving circuit is mounted on a display panel such that the display panel undergoes lighting inspection with a use of the lighting inspection device described in claim 7.

9. The lighting inspection device of claim 1, wherein the soft metal contains gold.

10. A method of inspecting a display panel, the method comprising:

detecting a defective panel before a driving circuit is mounted on a display panel such that the display panel undergoes lighting inspection with a use of the lighting inspection device described in claim 9.

11. The lighting inspection device of claim 1, wherein the soft metal contains silver.

12. A method of inspecting a display panel, the method comprising:

detecting a defective panel before a driving circuit is mounted on a display panel such that the display panel undergoes lighting inspection with a use of the lighting inspection device described in claim 11.

13. A method of inspecting a display panel, the method comprising:

detecting a defective panel before a driving circuit is mounted on a display panel such that the display panel undergoes lighting inspection with a use of the lighting inspection device described in claim 1.

14. A method of inspecting a display panel, the method comprising:

detecting a defective panel before a driving circuit is mounted on a display panel such that the display panel undergoes lighting inspection with a use of the lighting inspection device described in claim 2.

* * * * *